US006839270B2

(12) United States Patent
Perner et al.

(10) Patent No.: US 6,839,270 B2
(45) Date of Patent: Jan. 4, 2005

(54) SYSTEM FOR AND METHOD OF ACCESSING A FOUR-CONDUCTOR MAGNETIC RANDOM ACCESS MEMORY

(75) Inventors: Frederick A. Perner, Palo Alto, CA (US); James R. Eaton, Jr., Palo Alto, CA (US); Kenneth K. Smith, Boise, ID (US); Ken Eldredge, Boise, ID (US); Lung Tran, Saratoga, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 47 days.

(21) Appl. No.: 10/346,494

(22) Filed: Jan. 17, 2003

(65) Prior Publication Data

US 2004/0141364 A1 Jul. 22, 2004

(51) Int. Cl.[7] .............................................. G11C 11/00
(52) U.S. Cl. ...................................... 365/158; 365/232
(58) Field of Search ............................. 365/158, 225.5, 365/230.06, 173, 232, 213, 209, 189.01

(56) References Cited

U.S. PATENT DOCUMENTS 6,324,093 B1    11/2001  Perner et al.
6,657,889 B1 *  12/2003  Subramanian et al. ...... 365/158
2003/0128581 A1 *  7/2003  Scheuerlein et al. ... 365/185.03

OTHER PUBLICATIONS

Daughton, James M. "Advanced MRAM Concepts" NVE Corporation. (Feb. 2001) pp. 1–6.

* cited by examiner

*Primary Examiner*—Thong Q. Le

(57) ABSTRACT

A control circuit for writing to and reading from MRAMs comprising a row decoder; a first read/write row driver connected to the row decoder; a plurality of global row write conductors connected to the first read/write row driver; a plurality of row taps connected to each of the global row write conductors; and a second read/write row driver connected to the global row write conductors.

13 Claims, 6 Drawing Sheets

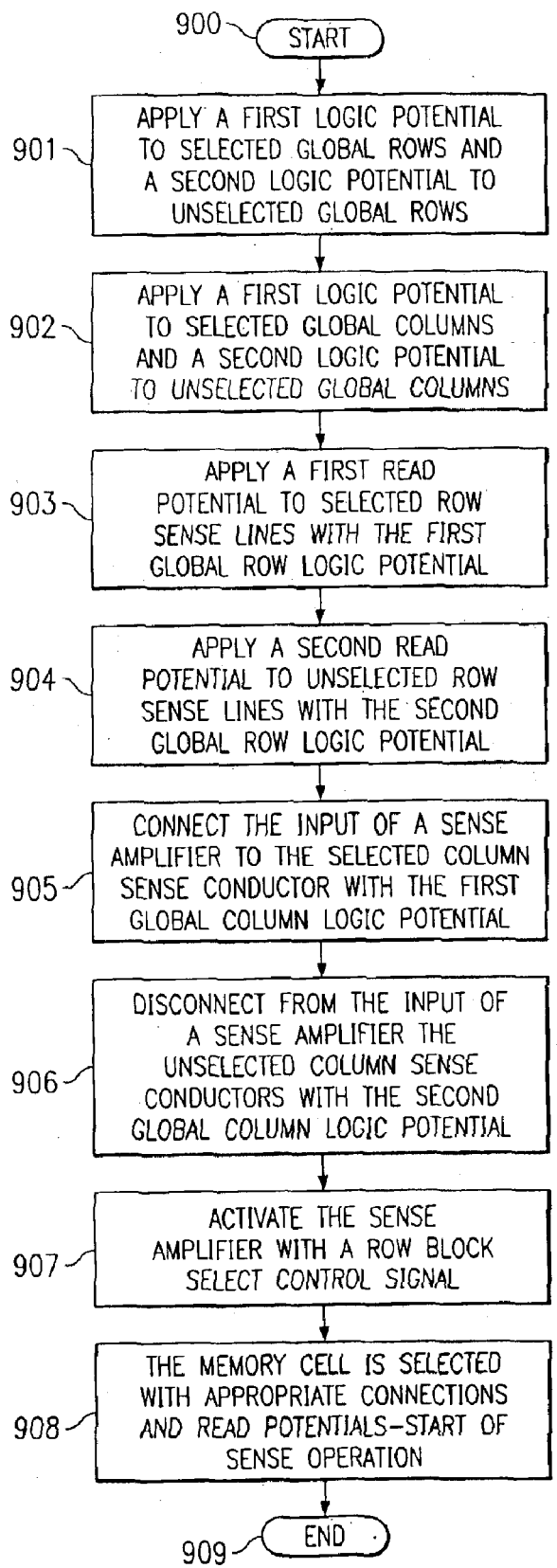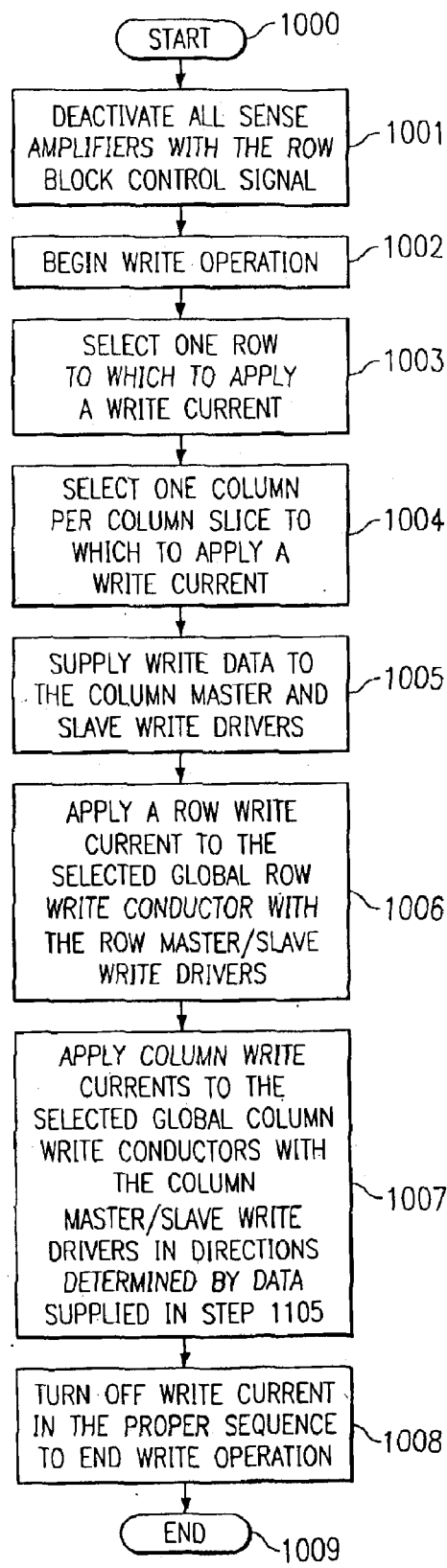

SYSTEM FOR AND METHOD OF ACCESSING A FOUR-CONDUCTOR MAGNETIC RANDOM ACCESS MEMORY

RELATED APPLICATIONS

The present application is related to commonly assigned U.S. patent application Ser. No. 10/346,700 entitled "SYSTEM FOR AND METHOD OF FOUR-CONDUCTOR MAGNETIC RANDOM ACCESS MEMORY CELL AND DECODING SCHEME," filed on the same date herewith, the disclosure of which is hereby incorporated by reference in its entirety.

FIELD OF THE INVENTION

The present invention relates to storage devices for general computer applications and more specifically to increasing the area efficiency ratio of magnetic random access memory used in general computer applications.

BACKGROUND OF THE INVENTION

Magnetic Random Access Memory (MRAM) may be used to store information, coded in a binary representation as one or more bits, for later retrieval and use. While conventional memory techniques, such as flash memory, Static Random Access Memory (SRAM), and Dynamic Random Access Memory (DRAM), use a stored charge or flip-flops to store information, MRAM may use magnetization to indicate the presence of a stored "1" or a stored "0". Two primary types of cell architecture may be used to implement MRAM, a resistor cross point array and a three-conductor memory cell array.

The simplest form of a resistor cross point memory array is a two conductor memory cell architecture shown in FIG. 1. In this architecture every MRAM cell is connected in parallel with every other MRAM cell in the array.

Referring to FIG. 1, a resistor cross point array includes an array of rows of metal conductors (x-direction) forming word lines 101 and columns of metal conductors (y-direction) forming bit lines 102. MRAM cells, or MRAM "bits," 103 are located at each orthogonal crossing of the word lines and bit lines. The MRAM is typically composed of thousands or millions of MRAM cells. MRAM may also be divided into groups or blocks of MRAM cells.

Each MRAM cell 103 typically has at least five layers. These layers include first and second conductors, first and second magnetic layers, and a high-resistance thin-film barrier or dielectric located inbetween the first and second magnetic layer. The first conductor is a portion of bit line 102. The first magnetic layer 104 is electrically connected to the first conductor, and is typically made primarily of a nickel-iron alloy or a nickel-iron-cobalt alloy, may include a crystalline structure and possibly other components, other elements or compounds. The first magnetic layer may be a free ferromagnetic layer, referred to as the free, data or soft layer. The second conductor may be a portion of word line 101. Second magnetic layer 105 is electrically connected to the second conductor and may also have a nickel-iron primary composition, including a crystalline structure and other elements that may be different from the first magnetic layer. Second magnetic layer 105 may be a fixed layer, referred to as the fixed layer, the pinned layer, or the reference layer. Second magnetic layer 105 may have slightly different characteristics than first magnetic layer 104. The high-resistance thin-film barrier or dielectric 106 is positioned between the first and second magnetic layers.

The magnetization in the data layer may be set by an induced magnetic field resulting from electric currents through the respective conductors. The induced field may be varied, in magnitude and/or direction, by varying the magnitude or direction of the electric current passed through the respective conductors. The resulting magnetic field may be a function of the current passed through the word line (row conductors) creating a first magnetic field and the current passed through the bit line (column conductors) creating a second magnetic field. In order to store a value in the data layer, the vector sum of the two fields, resulting from an electrical current passing through the word line and the bit line, needs to be large enough to overcome the coercivity of the data layer so as to change the direction of the magnetization in the data layer. Additionally, the currents in the word line and the bit line must be small enough to ensure that the magnetic fields created do not affect the values stored in nearby MRAM cells. When MRAM cells are exposed to the induced magnetic field of either a bit line or a word line alone (as opposed to both a bit line and a word line) the condition is referred to as "half-select" as opposed to the selected MRAM bit receiving an induced magnetic field from both a selected bit line and a selected word line.

Writing to a memory cell in the cell architecture requires a relatively high magnetic field. To write information into an MRAM cell a current must be passed through both the word and bit lines of a selected memory cell. Current passing through bit line 102 creates a magnetic field around the bit line. Similarly, current passing through word line 107 creates a magnetic field around the word line. The magnetic field in the free layer, data layer, or soft layer may be established by coupling an induced magnetic field by passing an electric current through the respective conductors. The induced field may be varied, in magnitude and/or direction, by varying the magnitude or direction of the electric current passed through the respective conductors. In particular, the magnetization on each side of dielectric 106 effects the tunneling current (leakage current) that flows through the dielectric in the MRAM cell. Current in bit line 102 in the direction of arrow 108 and current in word line 107 in the direction of arrow 109 are additive to cause the magnetization in the free magnetic layer in MRAM cell 103. Current in the bit line induces a magnetic field in a direction referred to as the easy axis. Current in the word line induces a magnetic field in a direction referred to as the hard axis. When a read voltage is applied across the selected MRAM cell from the bit line to the word line a tunneling current flows across the barrier of the MRAM cell and the magnitude of this current is dependent on the relative direction of the magnetization between the free magnetic layer and the fixed magnetic layer.

When current is present in direction 108 in bit line 102 and direction 109 in word line 107 magnetic fields are induced in the data layer to cause a magnetization in the same direction of the magnetic field in the fixed layer then the magnetization's are parallel and the resistance of the memory cell is a first value. This configuration may be used to represent, for example, a stored "1." Conversely, when direction 110 of the currents in bit line 102 and word line 101 induce magnetic fields in the data layer to cause a magnetization in the opposite direction of the magnetic field in the fixed layer the magnetization's are anti-parallel and the resistance of the memory cell is a second value somewhat greater than the first value. This configuration may be used to represent a stored "0."

As described, the memory state is determined by the resistance state of the selected MRAM memory cell that is determined by the amount of current flowing between a selected word line and a selected bit line. For example, a state of parallel magnetizations will yield a higher current than an anti-parallel state. The higher level of current indicates the direction of magnetization in the free magnetic layer is in the same direction as the magnetization in the fixed magnetic layer (referred to as the parallel state) and that may represent a stored "1", while a lower level of current may indicate an anti-parallel state with the direction of magnetization in the free magnetic layer is opposite to the direction of the magnetization in the fixed magnetic layer and that may represent a stored "0." In a resistance cross point array isolation devices are not included to segregate memory cells from one another. This requires that sensing schemes include adjustments to compensate for the parallel nature of the memory cells. One type of sensing scheme is Equi-Potential-Isolation.

An MRAM cell array that includes a common read and write bit line conductor and a common read and write word line conductor is called a two-conductor MRAM cell array. In a two-conductor MRAM cell array, a set of write circuits are required for every group or "block" of memory cells. A block of memory cells may include, for example, one to two thousand rows and five hundred to four thousand columns. For each block, write current drivers are required at all four sides of the array. These current drivers occupy a large amount of area thus reduce the capacity of the MRAM memory device. With a two-conductor architecture an independent set of row write drivers is needed for every array block. In this configuration the difficulty in reading and writing data to and from an individual MRAM cell increases as the size of the array increases.

One type of three-conductor memory cell array includes a switching or "steering" device associated with each MRAM cell. In practice, this steering device, typically a transistor, is located in the silicon layer that is on the silicon substrate and under the memory layers. Although diodes have been suggested as steering devices, they have not been successfully demonstrated. The three-conductor memory cell array includes a low resistance bit line, a low resistance word line and a thin inter-cell conductor. In this configuration, each memory cell is connected to the low resistance bit line and the thin inter-cell conductor; the inter-cell conductor is also connected to a switch transistor located in the silicon substrate. Alternately, a metal word line or a low resistance word line may be electrically isolated from the cell but processed to physically pass sufficiently close to the memory cell to allow induced magnetic fields from the low resistance word line to control the data to be stored in the free magnetic layer of the MRAM cell. A second word line formed in the silicon substrate may be connected to the gate of the silicon switch transistor. When data is written into the memory cell, the silicon switch transistor is deselected (turned off by the second word line) and write currents are passed through the selected bit and word lines to cause magnetization of the free layer of the selected memory cell. When the memory cell is being read, no current is passed through the first metal word line while the second word line is asserted to select the silicon switch (turned on by the second word line) and a read potential is applied to the selected bit line. To retrieve data, a read current passes through the selected bit line, memory cell, inter-cell conductor, and the selected silicon switch transistor. A read sense amplifier connected to the selected bit line is then used to determine the resistance state of the memory cell from the resultant bit line current.

In a three-conductor memory cell array, the metal word line typically extends over the entire memory chip. By extending the metal word line over the entire memory chip only two write circuits are required, one located on the left side and one located on the right side of the chip, for the entire chip. This is in contrast to a two-conductor MRAM wherein write current drivers are required for each block of memory cells. By using the three-conductor memory cell array, fewer word line write drivers are required, so that more space is available for memory cells resulting in a larger capacity memory.

A second type of three-conductor MRAM cell includes a low resistance bit line, a low resistance word line and a thin sense line. In this configuration, the low resistance, metal bit line passes over, but may be electrically isolated from the thin sense line. The sense line is connected to one terminal of a memory cell and the other terminal of the memory cell is connected to the low resistance, metal word line. The sense line is connected to a small group of memory cells and to a switch transistor formed in the silicon substrate. The switch transistor is controlled by the metal bit line and is activated only during read operations. In this configuration, a write operation generates a current through the selected bit and word lines to set the magnetization direction of the free magnetic layer to correspond to the write data assigned to the selected memory cell. A read operation applies a read potential to the selected word line with the switch transistor turned on to pass a read current from the selected word line, through the selected memory cell, the thin sense line, the switch transistor and into a sense amplifier located in the substrate.

In the second type of a three-conductor memory cell array, the metal bit line conductor extends over the entire length of memory chip. By extending the conductor over the entire length of the memory chip only two write circuits are required, one on the top and one on the bottom of the chip, rather than requiring write circuits for each block of memory cells as in a two-conductor MRAM. Thus, by using the three-conductor memory cell array, more memory cells may be included on a chip resulting in more efficient use of the chip real estate.

The memory cells are not limited to any particular type of device. For example, the memory cells may be Spin Dependent Tunneling ("SDT") devices. A typical SDT device includes a "fixed" magnetic layer and a "free" magnetic layer. The fixed layer has a magnetization that is oriented in a plane, but fixed so as to not rotate in the presence of an applied magnetic field on a range of interest. The free layer has a magnetization orientation that is not fixed. Rather, the magnetization may be oriented in either of two directions along an axis (the "easy" axis) lying in the plane. If the magnetization of the free and fixed layers are in the same direction, the orientation is said to be "parallel." If the magnetization of the free and fixed layers are in opposite directions, the orientation is said to be "anti-parallel." The free layer and the fixed layer are separated by an insulating tunnel barrier. The insulating tunnel barrier allows quantum mechanical tunneling to occur between the free and fixed layers. This tunneling phenomenon is electron spin dependent, making the resistance of the SDT device a function of the relative orientations of the magnetization of the free and fixed layers.

For instance, the resistance of the memory cell is a first value R if the orientation of magnetization of the free and fixed layers is parallel. Resistance of the memory cell is increased to a second value R+deltaR if the magnetization orientation is changed from parallel to anti-parallel. A typical resistance R may be about one megaohm. A typical change in resistance deltaR may be about 10% of the resistance of R.

FIG. 2 shows one three-conductor memory cell architecture in which sense conductor 201 is added to the two-conductor memory cell architecture. In this configuration word lines 101 and bit lines 102 are used to write data into a selected MRAM cell. Sense conductor 201 may be used to read data out from the MRAM cells. In this configuration the sense line is connected to one terminal of the MRAM memory cell and is typically formed as a very thin conducting layer. Here word lines 101 may be a thicker low resistance conductor, electrically insulated from the sense line, that runs in parallel to the sense line. A fairly high current may be applied to this word line 101 for writing.

With the second type of three-conductor cell architecture, the set of column write drivers is reduced to only one set located at the top and bottom of the memory chip (over many memory array blocks) eliminating column write drivers from between memory array blocks. Thus, the three-conductor cell architecture improves the area efficiency ratio by making the memory chip smaller, eliminating the inter-block column write drivers. In addition the column decode circuitry is placed underneath the three-conductor memory cell array to further reduce space requirements. However, the three-conductor memory cell does not reduce or alleviate the space requirements for developing currents in the row direction.

SUMMARY OF THE INVENTION

One embodiment of the invention includes a control circuit for writing to and reading from MRAMs comprising a row decoder; a first read/write row driver connected to the row decoder; a plurality of global row write conductors connected to the first read/write row driver; a plurality of row taps connected to each of the global row write conductors; and a second read/write row driver connected to the global row write conductors.

BRIEF DESCRIPTION OF THE DRAWINGS

FIG. 9 is a flow diagram for applying read potential to an array comprised of four-conductor MRAM cells; and FIG. 10 is a flow diagram for applying write currents in an array comprised of four-conductor MRAM cells.

DETAILED DESCRIPTION

Figure 1:
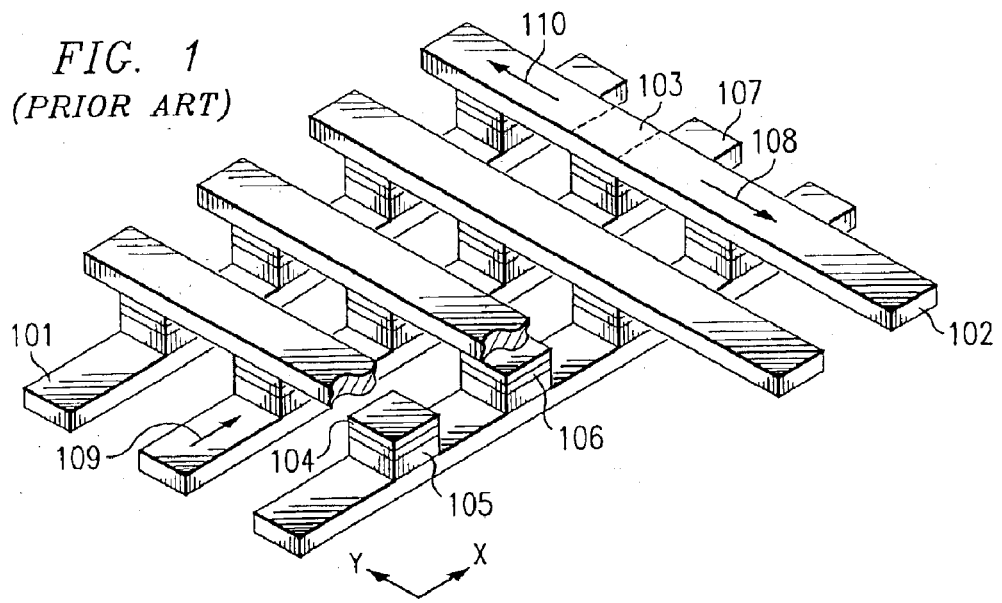
FIG. 1 is an illustration of a two-conductor resistor cross point MRAM architecture.

The use of MRAM chips in electronic devices is expected to enhance the electronic devices in a number of ways. These enhancements include a reduction in the amount of power required to store and access data, "instant on" and "instant off" capabilities, and the reduction of data loss associated with the loss of power before data may be moved from volatile Random Access Memory (RAM) to nonvolatile long term storage such as storage on the hard or fixed drive. The present invention provides a substantial increase in the area efficiency ratio (the memory available per required space) associated with MRAM. One embodiment of the present invention includes a four-conductor MRAM design that increases the area efficiency ratio of MRAM. Another embodiment of the present invention includes circuitry configured to read from and write to four-conductor MRAM cells.

An embodiment of the present invention includes the addition of a fourth conductor on a MRAM chip and an architecture having row taps and column taps for reading data from, and writing data to, the MRAM cells. The taps include tiny active circuits between the arrays as an efficient means for connecting signals that are conveyed along the write conductors to the appropriate rows and columns that are being read. The use of cross-chip write conductors with row and column taps make possible more efficient use of MRAM.

The four-conductor cell includes connections and/or conductors for (1) a local column sense line; (2) a local row sense line; (3) a global column write line; and (4) a global row write line. In one embodiment of the present invention a single global row and column decoder are used to access the memory array. The local row tap may support a potential level sensitive or "V-mode" sense amplifier or a current sensitive or "I-mode" (equi-potential) sense amplifier. In one embodiment of the invention a local column tap selects one of a number of columns to input to a sense amplifier. Similarly, a local row tap selects one of a number of rows to electrically connect to a sense amplifier. Local row and column taps primarily fit outside the footprint of the sub-array. The area under the sub-arrays may be devoted to sense amplifier layout. A row group control signal (1) applies a second potential only to the rows in the selected group and (2) selectively gates on or off a sense amplifier associated with the selected row group. Row/column decoders in read mode apply row/column decode information (logic signals) to third and fourth conductors. In a write mode circuits 609, 610, 702 and 801 of FIG. 8 switched in at the periphery of the global array apply the write currents. In a preferred embodiment, one local row tap and one local column tap may be required per row/column/plane.

The fourth conductor is used to access MRAM cells while reducing the required hardware resources on the chip. A fourth conductor may be a thin conductor that runs parallel to a thicker, very low resistance row conductor line. The MRAM memory chip-area efficiency ratio may be improved by using one set of row write drivers located on each side of the chip that allows the inclusion of additional memory cells on the chip. An embodiment of the present invention also includes methods of using the four-conductor MRAM.

Figure 3:
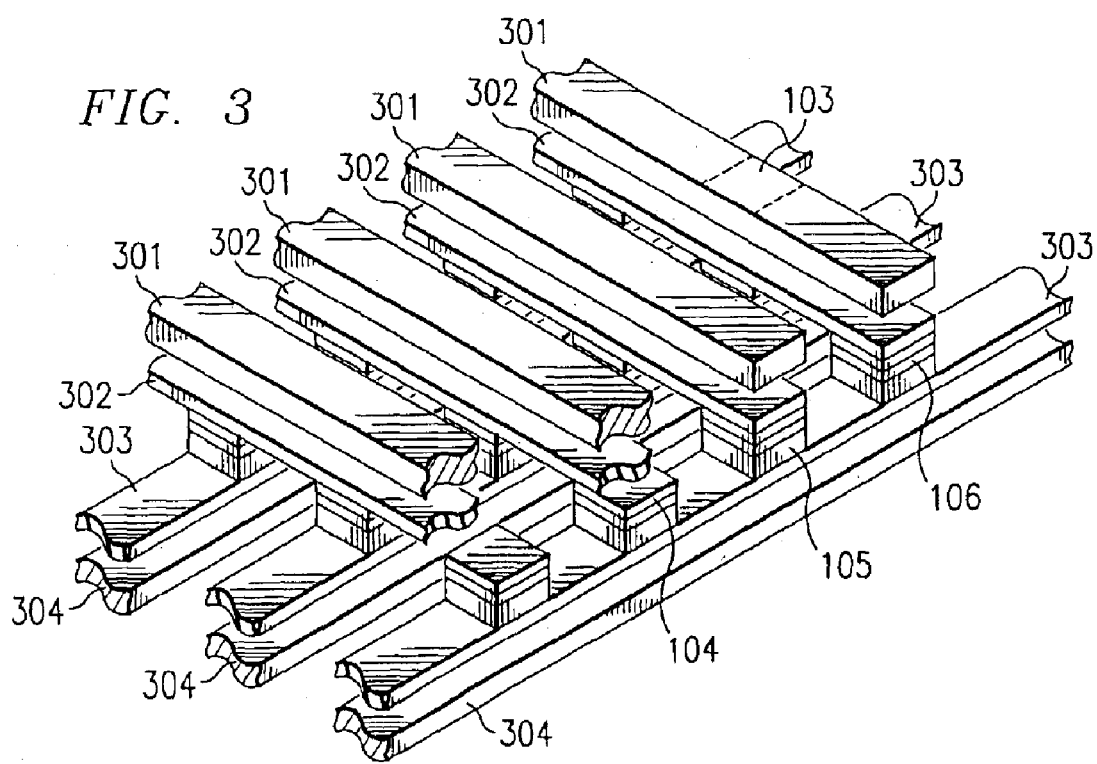
FIG. 3 is a partial view of a four-conductor MRAM architecture of one embodiment of the current invention.

FIG. 3 is a partial perspective view of a portion of a four-conductor MRAM architecture of one embodiment of the present invention. A complete MRAM architecture may include thousands of bit lines and thousands of word lines and, at the intersection of each of the bit lines and the word lines, an MRAM cell. FIG. 3 illustrates the four-conductor MRAM within a resistor cross point MRAM architecture. The four-conductors of the MRAM include global column write conductor 301, local column sense conductor 302, local row sense conductor 303, and global row write conductor 304. Global column write conductor 301 may be similar to bit line 102 of FIG. 1. Local column sense conductor 302, having relatively low current carrying requirements, may be a high resistance and very thin conductor layer. Local column sense conductor 302 is electrically insulated from global column write conductor 301. Local row sense conductor 303 may be a "thinned" version of word line 101 that connects to each MRAM cell. Global row write conductor 304 may be a low resistance metal conductor added over the top of local row sense conductor 303 with an appropriate intervening insulator therebetween.

The four-conductor MRAM cell used in FIG. 3 may be described as a cube structure. At the top of the cube structure is a data layer or data magnet. Beneath the data layer is a thin insulated cell layer. On the bottom of the cube structure is the reference or fixed layer. Note that the data and reference layers could be reversed.

The top data layer of each four-conductor MRAM cell of a particular row of memory may be wired or connected to bit lines that travel in a vertical direction. Similarly the bottom reference layer of each four-conductor MRAM cell of a particular row of memory may be wired or connected to word lines that travel in a horizontal direction. Typically MRAM may consist of one to two thousand rows of MRAM cells and two to four thousand columns of MRAM cells. Each of these two-conductors (local column sense conductor 302 and local row sense conductor 303 of FIG. 3) that actually connect to and/or are in contact with each MRAM cell are relatively thin conductors. This is because the two-conductors must be made thin to maintain a close spacing of the MRAM data layer to the two write conductors for the magnetic fields generated in the write conductors to maximally couple into the data layer. The two-conductors may be thin because they convey relatively small sense currents and therefore may have a high resistance. The local row sense conductor is sometimes also referred to as a word sense conductor or word line. The local column sense conductor may be referred to as a bit sense conductor or bit line. The local word sense conductor and local row sense conductor are used in the read process.

Note for ease of the present description only, terms signifying absolute orientation such as "vertical" and "horizontal" are used. However, these terms are used only to assist references to the drawings wherein the respective structures are depicted in the referenced orientations. Embodiments may provide for other orientations including, but not limited to, orientations of structures relative to each other consistent with the absolute orientations described and/or depicted.

In parallel with these sense conductors (local column sense conductors and local row sense conductor) are a set of thicker conductors forming relatively low resistance interconnect wires. These parallel conductors (the global column write conductor and the global row write conductor) are used in both the write process and the read process. A write process typically effects one row at a time, but may affect more than one column at a time, typically 16 or less columns at one time. As previously described, during the write process, a write current is passed in both the respective column and the respective row such that a magnetic field is created in the cell at the intersection of the column and row so as to thereby selectively orient the data in the data layer with that magnetic field. Supplying a positive or a negative current in the bit line enables the magnetic field in the data layer to vary between a parallel and anti-parallel state. As used herein, "positive" and "negative" refer to relative direction of a current; the terms "parallel" and "antiparallel" likewise refer to opposite directions of a magnetic flux. These conductors are known as global row write conductors and global column write conductors. In the read process, the parallel conductors (the global column write conductor and the local sense conductor or the global row write conductor and the local row sense conductor) convey address decode logic signals to the gates or the row and column taps.

One embodiment of the four-conductor MRAM device may include an array of memory cells, where each of the memory cells includes a first conductor, a first magnetic layer, a dielectric, a second magnetic layer and a second conductor. The first conductor of the array of memory cells may be electrically connected to one of a plurality of local column sense lines 302. The second conductor of the array of the memory cells may be electrically connected to one of a plurality of local row sense lines 303. A plurality of global column write lines 301 may be parallel to the plurality of local column sense lines 302. A plurality of global row write lines 304 may be parallel to the plurality of local row sense lines 303. The plurality of local column sense lines 302 and the plurality of local row sense lines 303 are used to read data from the array of memory cells 103 and the plurality of global column write lines 301 and the plurality of global row write lines 304 may be used to write data to the array of memory cells 103. Each of the plurality of local column sense lines 302, and each of the plurality of local row sense lines 303 are relatively thin and may be comprised of a relatively high resistivity material. Each of the plurality of global column write lines 301 and global row write lines 304 are a low resistance, thicker conductor, with a thickness from, 5 to 50 nanometers inclusive, and are electrically insulated from the plurality of local column sense lines 302 and the plurality of local row sense lines 303. The array of memory cells 103 may include stacking planes of memory cells, on top of each other, to increase the memory density or real estate efficiency of the memory structure.

As described, this embodiment of the present invention includes a support circuit for writing to and reading from four-conductor MRAMs including a row decoder; a first read/write row driver connected to the row decoder; a plurality of global row write conductors 402, 403 (FIG. 4) connected to the first read/write row driver; a plurality of row taps connected to each of the global row write conductors; and a second read/write row driver connected to the global row write conductors.

One feature of this structure is relatively close spacing between the conductors, required by the weak coupling from the conductor to the MRAM cell. The vertical distance between the conductors is maintained by the thickness of the sense conductors that are typically on the order of 200 angstroms thick and by the thickness of the dielectric (on the order of 200 angstroms) separating the parallel write conductors from the sense conductors.

A preferred method of writing information to and reading information from a four-conductor MRAM as described may use the write conductors (global row 304 write lines and global column write lines 301) as a path to carry decode data. Decode circuits receive an address and apply a select voltage to the appropriate column and row conductors, and apply a deselect voltage to the remaining nonselected rows and columns in the memory configuration. The decode data contains information selecting a row and a column that define the target MRAM cell of the read or write operation. The select voltage may be conveyed along the row and column low resistance conductors also known as the write conductors.

Figure 4:
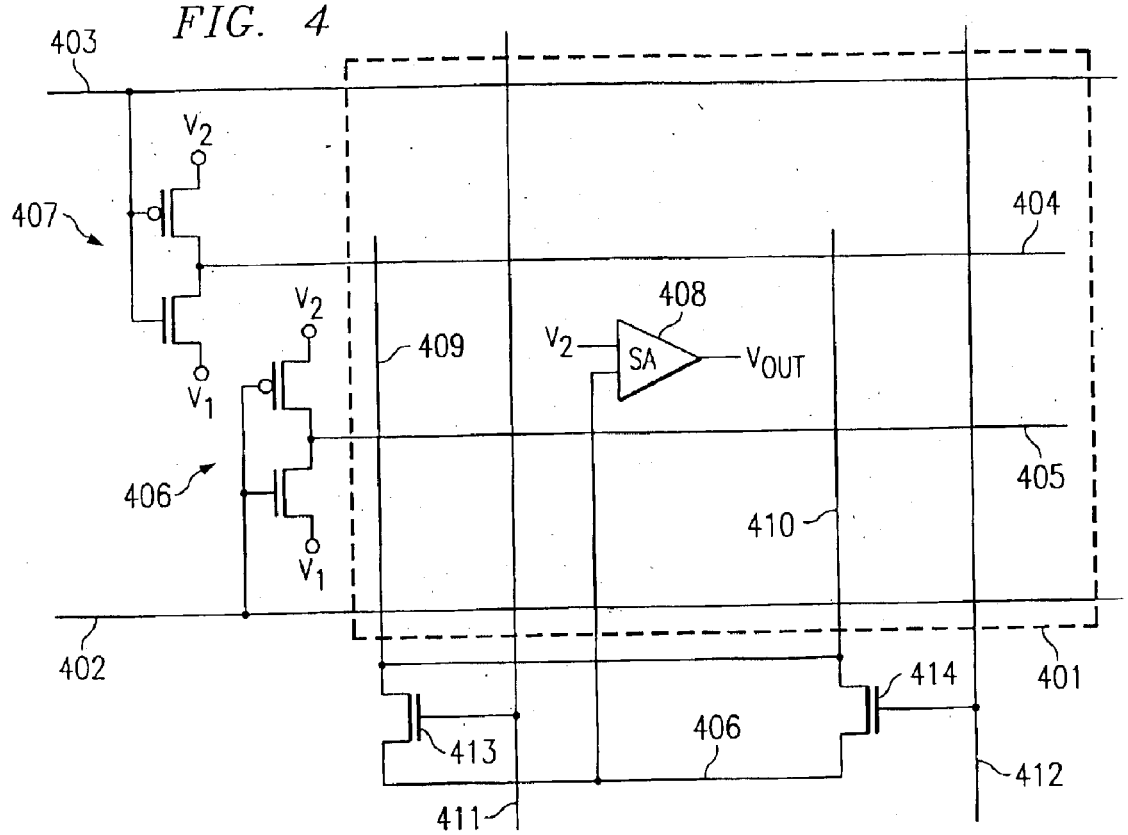
FIG. 4 is a diagram of circuitry used to access the four-conductor MRAM of FIG. 3 using row and column taps for a single block.

FIG. 4 is a diagram of circuitry used to access the four-conductor MRAM of FIG. 3 using row and column taps for a single block. In one embodiment of the present invention, at the edges of the MRAM arrays, taps are made to (1) global column write lines 301 and global row write lines 304 to control access transistors to connect a selected local row line to an appropriate select read potential and all unselected row lines to a second deselect read potential and (2) to connect selected sense lines 302 and 303 to a sense amplifier, leaving all unselected sense lines in a high impedance or "float." This implementation avoids the need for the circuitry previously associated with accessing MRAM cells from beneath the MRAM arrays. Instead, the area below the array of MRAM cells may be used for the required sense amplifiers. MRAM array 401 may be the area in which the array of memory cells are placed. This array typically is 512 to 4,096 (i.e., 4K) columns "wide" by 1,024 (1K) to 2,048 (2K) rows "high" although these are only typical ranges based on present fabrication methods and current device requirements. Sense amplifier 408 circuitry may be formed in the portion of the silicon substrate beneath the memory cells. FIG. 4 also includes four parallel horizontal lines including two global row write conductors 402, 403 and two local row conductors, i.e., row sense lines 404 and 405. The two global row write conductors 402 and 403 constitute the fourth conductor row lines that are added to the previously described three-conductor MRAM cell. A signal present on global row write conductor 402 is connected to inverter 406 that is connected to voltage levels V1 and V2. Inverter 406 is responsive to the signal on global row write conductor 402 to selectively supply either V1 or V2 to local row conductor 405. FIG. 4 shows a P-channel transistor and an N-channel transistor may be used as an inverter circuit to connect to signals V1 and V2. For example, in response to a high level signal on global row write conductor 402, inverter 406 connects local row conductor 405 to V1. At the same time, all of the other row lines are deselected, and a low level signal (i.e., a low voltage) is provided on the associated nonselected row write conductors. A low level signal present on row write conductor 403 electrically connects the respective local row conductor 404, through inverter 407 to V2. Sense amplifier 408 also used V2 as a sense reference level. This combination of relatively simple devices, located on the outside of the array, is used to provide a signal from the fourth conductor row lines (that go over the top of the array) and conduct the signals read from a selected MRAM cell to the local row lines for sensing.

FIG. 4 also includes four vertical parallel signal lines including two global column write lines 411, 412 and two local sense conductors 409, 410. Global column write lines 411, 412 and sense conductors 409, 410 operate in a manner similar to that described above for the global row write conductor and row sense lines. Global column write conductors 411, 412 are the third conductor column lines comprising low resistance lines that run over the top of the entire array of MRAM cells and conduct write signals to each of the MRAM cells. Global column write conductors 411, 412 also conduct column select data from the respective column decoder circuits. The signal reference here is the output of the column decoders, the selected column decode data is a logic "Hi" and the non-selected column decode data is a logic "Lo." Column select transistors 413, 414 are connected to local sense lines 409, 410 respectively. A column or bit line may be selected by applying a logic high level signal to the third global column write line, turning on the column select transistor so as to connect one local sense line to the input of sense amplifier 406. The remaining nonselected local sense lines are associated with respective global column write conductor lines having a logic low level signal turning-off the column select transistors. For example, when a high level signal is present on conductor 411, column select transistor 413 is biased on to conduct thereby electrically connecting sense column 409 to signal line 406 and an input of sense amplifier 408.

The nonselected bit lines are associated with logic low signals on the global column write line; only the selected columns have a global column line with a high level signal. For example, when a high level signal is present on conductor 411, other conductors such as global column write conductor 412 are electrically connected to a logic low signal. This electrical connection ensures that column select transistor 414 is biased off so that sense column 410 is isolated from sense amplifier 408. All other select transistors associated with nonselected column lines are connected to a logic low signal to ensure the respective transistors are biased off and the associated local sense lines are electrically disconnected from the associated sense amplifier. In any one group of columns, only one local sense line is connected to a sense amplifier at a time.

In a preferred embodiment a single sense amplifier may be associated with a number of columns, typically corresponding to a grouping of columns such as 64, 128 or 256 columns. These groups of columns are located in close proximity to each other, e.g., immediately adjacent. A single MRAM array that contains 2K (i.e., 2048) columns of cells in column groups of 256 columns to a single sense amp, thereby requiring a total of only eight sense amplifiers underneath the array of 2K columns. FIG. 4 illustrates that low resistance third 402 and 403 and fourth conductors 411 and 412 convey signals for selecting and deselecting memory cells in both the rows and columns thereby simplifying circuit requirements for connections to the sense amplifier. This is done in decoder circuits 608 and 703 and write driver circuits 609, 610, 702 and 801 in FIG. 8.

A sub-array organization of the larger overall array may be dictated by the length of the local bit lines (sense lines) and local word lines. Sense amplifier sensitivity and noise generally dictate the maximum length of the local lines operating in read mode. Preferably, the local lines have sufficient length to fit a complete sense amplifier/integrator/comparator along with some additional support circuits entirely under the footprint of the sub-array. In FIG. 4 two read potentials are indicated, V1 is a read potential applied to selected word sense line 405 and V2 a second potential applied to non-selected word sense lines 404 and as a reference to sense amplifier 408. V2 is part of the Equi-Potential method of sensing MRAM.

Figure 5:
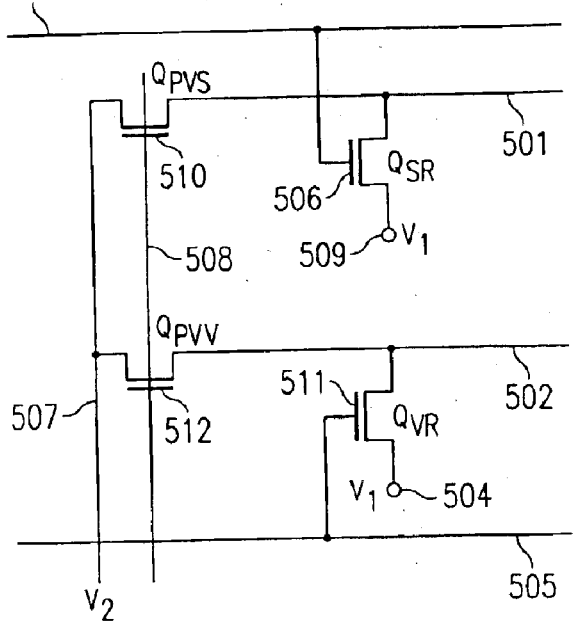
FIG. 5 is a diagram of an alternative embodiment for row taps to access the MRAM of FIG. 3.

FIG. 5 is a diagram of an alternative embodiment for row taps to access the MRAM of FIG. 3. In FIG. 5 two N-channel transistors 506 and 511 are used to provide the select function. In one embodiment, N-channel transistor 506 is connected between local row sense line 501 and first read potential V1 509 and second N-channel transistor 511 is connected between local row sense line 502 and first read potential V1 504. Note that read potential V1 504 may be identical to read potential V1 509. FIG. 5 illustrates a more efficient means of providing the select function. The integration of a circuit with both P-channel and N-channel transistors requires more area than a circuit with similar functions using only N-channel transistors. N-channel transistors layout in a smaller area than P-channel transistors because in most typical CMOS processes, N-channel transistors are placed in a P-type substrate that is common to all N-channel transistors and P-channel transistors must be placed into N-type diffusions (referred to as N-wells) that are set into the P-type substrate. The N-wells are deep diffusions and require a considerable amount of area compared to N-channel transistors. Hence, a design using only N-channel transistors will always layout in an area much smaller than a design that contains both N and P channel transistors. Two long channel, low current, N-channel transistors 510 and 512 are connected to local row sense lines 501 and 502 and to second read potential V2 507. Gate control for long channel transistors 510 and 512 is a row block control signal 508 routed in the substrate from row decoders 608 in FIG. 6.

Selected local row sense line 501 is connected to V1 and nonselected local rows 502 are connected to V2. During a read operation, selected global row 503 is connected to a logic high level signal and nonselected global rows 505 are connected to a logic low level signal. Nonselected local rows 502 are each connected to V2 507 through long channel N-channel transistor 512 having a gate controlled by row block decode signal 508. A long channel transistor is used whenever a low current drive or high resistance circuit element is required. In this case, all the long channel transistors are turned on with signal 508, unselected local sense rows 502 are connected to V2 507 through transistors 512 (note transistor 511 is off) and selected local row 501 is connected to both V2 through 510 and to V1 through 506, however, 510 is a long channel transistor with a weak current drive and 506 is a short channel transistor with a strong current drive and the net is transistor 506 is effective in pulling selected local row sense line 501 to V1 509 even while long channel transistor 510 is on. In this configuration, long channel transistor 512 attempts to connect nonselected local rows 502 to V2 507 by providing a limited current through transistor 512 and attempts to connect the selected local row sense line 501 to V2 507 by providing a limited current through long channel transistor 510. Unselected row select transistor 511 is turned off and unselected local rows 502 are pulled to V2 507 with the limited current through long channel transistor 512. However, selected row transistor 506 has a greater capacity so as to "pull" selected row 501 to V1 509 and pass both the current from selected row 501 and the current from the pull up transistor 510. In this configuration long channel transistors 510, 512 are efficient with respect to interconnections and layout. In a preferred embodiment fourth conductor 503 electrically connects the gate of selected row transistor 506 to a logic high level signal. Fourth conductor 505 electrically connects each of the gates of nonselected row transistors 511 to logic low level signal. Selected local sense row 501 may be active to read data from a cell with transistor 506 effectively pulling the local sense row to V1 while long channel transistor 510 is conducting a limited current from V2.

Gate line 508 controls the gates of long channel transistors 510, 512 and may be asserted during a read operation to connect the nonselected row sense lines 502 to V2 507. In this example, both transistors 510 and 506 are turned on and are connected to the selected local row sense line 501. The sizing of transistors 506 a short channel transistor, and 510 a long channel transistor will result in short channel transistor 506 dominating the control of the selected local row sense line 501 so that the resultant potential on the local row sense line 501 will be maintained at V1 509. Selected local sense row 501 is active and all others have all transistor 511 turned off and transistor 512 turned on. Unselected local word lines 502 in the unselected group are electrically connected to V2 507. Only selected local word line 501 may be electrically connected to V1 509. During a read operation transistors 506 and 510 are turned on and selected local sense row 501 is set to first read potential V1 509 and transistor 511 is turned off and transistor 512 is turned on and unselected local sense row 502 is set to second read potential V2 507.

Transistors 510 and 512 are long channel transistors that ensure non-selected local sense rows 502 are connected to second read potential V2 507 through low current devices. Selected local row sense devices 506 have a relatively high current capability devices to pull selected low row lines to V1 509. Note that the current drive capability of transistor 506 is much greater than the drive capability of transistor 510 and the current drive required by the sense currents on the local sense row, hence, the local sense row is controlled by short channel transistors 506 and is pulled down to V1 509.

Figure 6:
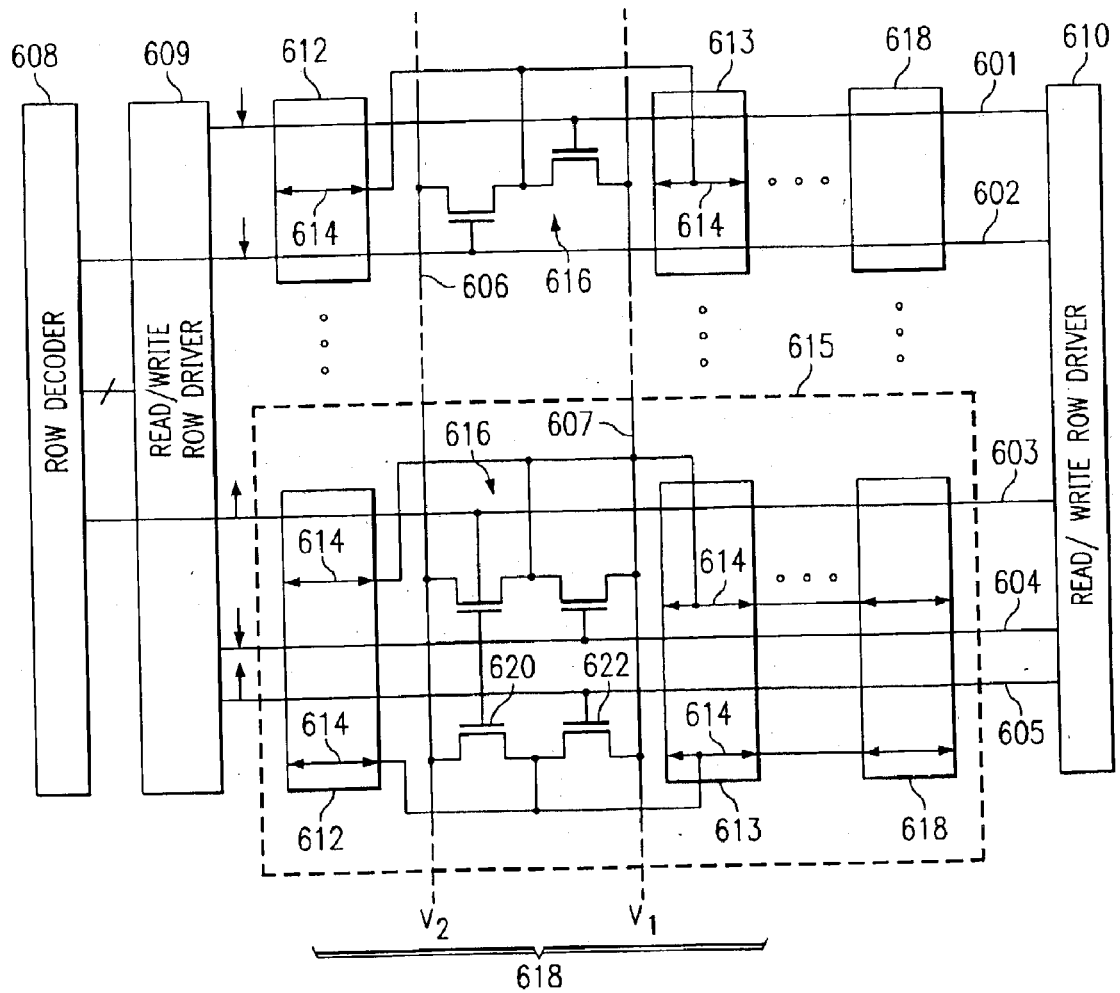
FIG. 6 is a detailed diagram of one embodiment of a row circuit for accessing the MRAM of FIG. 3.
Figure 2:
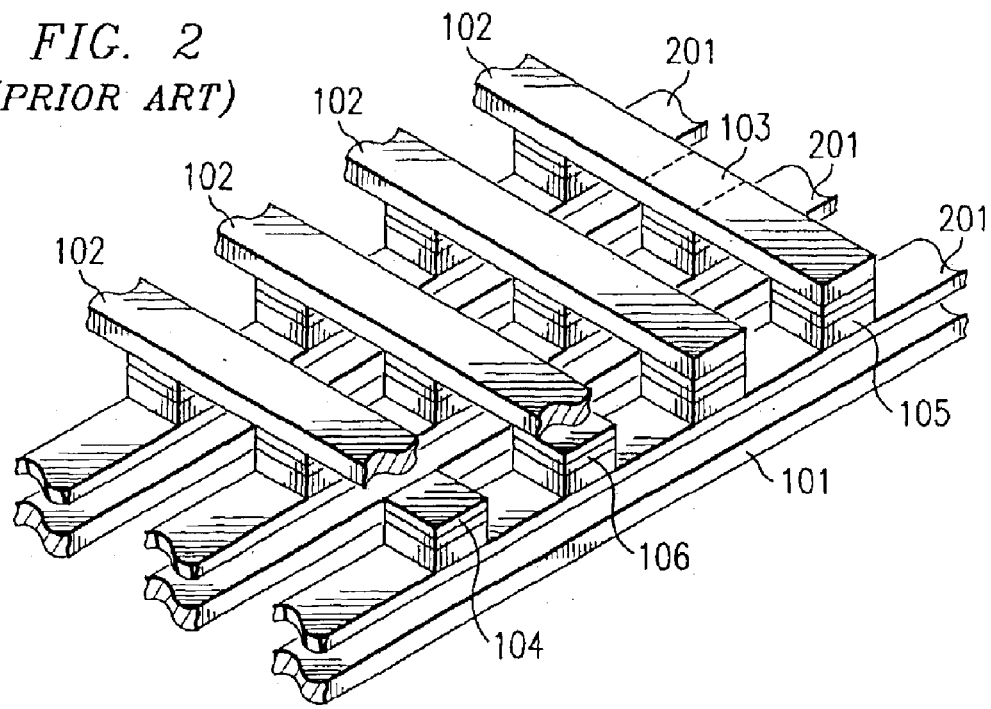
FIG. 2 is diagram of a three-conductor MRAM architecture.

FIG. 6 is a schematic diagram of one embodiment of a row circuit for accessing the MRAM of FIG. 3. FIG. 6 includes master row decoder 608 that demultiplexes a binary address signal received to designate the addressed row. Master read/write row driver 609, and slave read/write row driver 610 serve similar functions. Note that the row write driver is a simple current source where master read/write row driver 609 is the current source and slave read/write row driver 610 is the current sink. The row write current flows from master read/write row driver 609 to slave read/write row driver 610. Row decoder 608 is a true decoder selecting one row of n as an active row and the remainder as inactive rows. n is the total number of rows in the array. MRAM cells are located within memory array blocks 612 and 613. Two adjacent memory blocks 612 and 613 share one row tap 616 to apply read potentials V1 607 or V2 606 to local sense lines 614 in memory array block 612 and memory array block 613. Memory blocks 612 and 613 share a common row tap circuit. Memory blocks 612 and 613 and row tap 616 comprise a building block 618 for the array and are repeated to comprise the entire array. While FIG. 6 shows two rows of groups of memory blocks, similar arrangements may be configured to support memory configurations that include any number of memory blocks.

Only one row 605 in the memory array may be selected for a read operation with all remaining rows 601 and 604 are unselected. Rows 601 and 604 are illustrated as unselected and do not, therefore, affect the read operation. Row 605 may be selected with all other rows within the memory group are unselected. Row block control signals 602 and 603 from row decoder 608 are routed to the row taps of the group of memory cells containing the selected row and the unselected rows. The combination of row control signals 604 and 605 and row block control signal 603 apply first read potential V1 607 to the selected local sense rows and second read potential V2 606 to all the unselected local sense rows. FIG. 6 includes a row tap circuit of FIG. 5 in building block 618 shared with two MRAM array blocks 612 and 613. Rows in memory group 612 are illustrated as unselected and do not, therefore, affect the read operation. Within memory group 615, row 605 may be selected with all other rows within memory group 615 unselected. FIG. 6 illustrates the relationship between the long and short channel transistors for selected row 605. At location 618 shared row tap and two memory blocks are shown.

Figure 7:
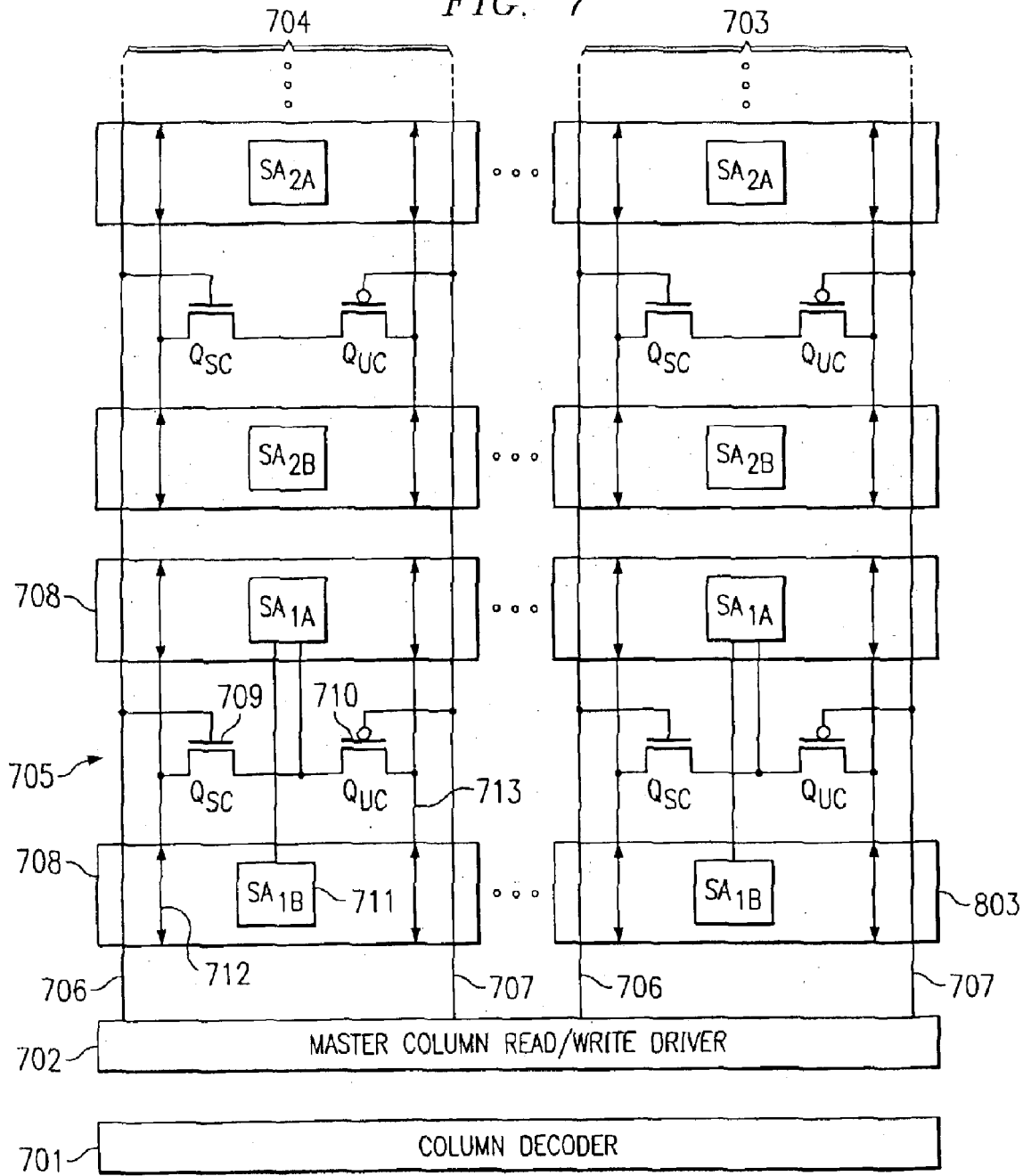
FIG. 7 is a detailed diagram of one embodiment of column circuits for accessing the MRAM of FIG. 3.

FIG. 7 is a schematic diagram of one embodiment of column circuitry for accessing the MRAM of FIG. 3. FIG. 7 is similar to FIG. 6 but illustrates the column circuits. In the lower portion of the figure, column decoder 701 provides a select signal on an addressed column select line to master column read/write driver 702. While not shown, a second column decoder and associated slave column read/write driver are also located at the top of the memory array. The embodiment shown in FIG. 7 includes two columns of MRAM array blocks 703 and 704. Each MRAM array block includes many columns of MRAM memory cells. In each column of MRAM array blocks, the column decoder selects one active column 706 and non-selects all the remaining columns 707 in the column of array blocks. Each column of array blocks is organized as a pair of MRAM array blocks 708 separated by a shared column tap 705. Note that memory blocks 703, 704 may be repeated to build a large MRAM array. Columns of MRAM array blocks (703 and 704) may be considered as column slices with one such column slice 704 illustrated in FIG. 7. A column slice may be 64, 128, 256, 512, or greater columns wide with each column slice corresponding to one bit of a memory word and the memory may be expanded by repeating column slices to achieve a desired memory configuration. Typically, a word stored in a memory is configured in groups of eight bits. Examples of typical word size include 8 bits, 16 bits, 32 bits, 64 bits, 512 bits, 1024 bits, 2048 bits and 4096 bits.

In the embodiment of FIG. 7 selected column 706 is connected to the gate of a switch transistor 709 that connects local column sense conductor 712 to the input sense amplifier 1A/B 711. The sense amplifier is represented as two blocks 1A and 1B to acknowledge the physical layout of sense amplifier 1 may be split and be located under two groups of MRAM memory cells 708 separated by a shared column tap circuit 705. Additionally, nonselected columns 707 may be connected to a logic low level signal or alternatively, nonselected local column sense lines need not be connected to a second potential but allowed to "float." In this embodiment the column tap 705 may be a single transistor either Select Column ($Q_{SC}$) transistor 709 or Unselected Column ($Q_{UC}$) transistor 710. Each column slice, such as column slice 703, is composed of groups of MRAM arrays 708 with shared column taps 705 and one sense amplifier 711. Selected column 706 transmits a logic high level signal to the gate of select column transistor 709. At each local column tap, such as column tap 705, selected column 706 turns on transistor $Q_{SC}$ 709 to connect the associated local sense lines to the inputs of the associated sense amplifier 711. At the same time the third conductors of nonselected column 707 receive a logic low level signal so that transistor $Q_{UC}$ 710 remain off. A row block control signal turns on only the sense amplifier associated with the selected row, for example sense amplifier 711 for column 706. The MRAM arrays are arranged as rows of MRAM arrays and through the MRAM arrays the arrays are grouped in units of column slices. All other sense amplifiers remain off. The local column tap circuit ideally will split the local sense lines (minimize the effect of local column sense line resistance). In one embodiment, the column tap is physically placed in the center of the local sense line so that half the sense line resistance is seen from the point of the column tap to the furthest point on the sense line. In this embodiment, the performance of the sense amplifier is sensitive to the sense line resistance and smaller is better. The local column tap circuit also fits between the local sub-arrays resulting in an efficient layout while requiring a minimum number of transistors. The local column tap circuit also enables the complete sense amplifier to fit under the two sub-array blocks (sense amplifier number 711 and sense amplifier 711 comprised of SAIA and SAIB).

Figure 8:
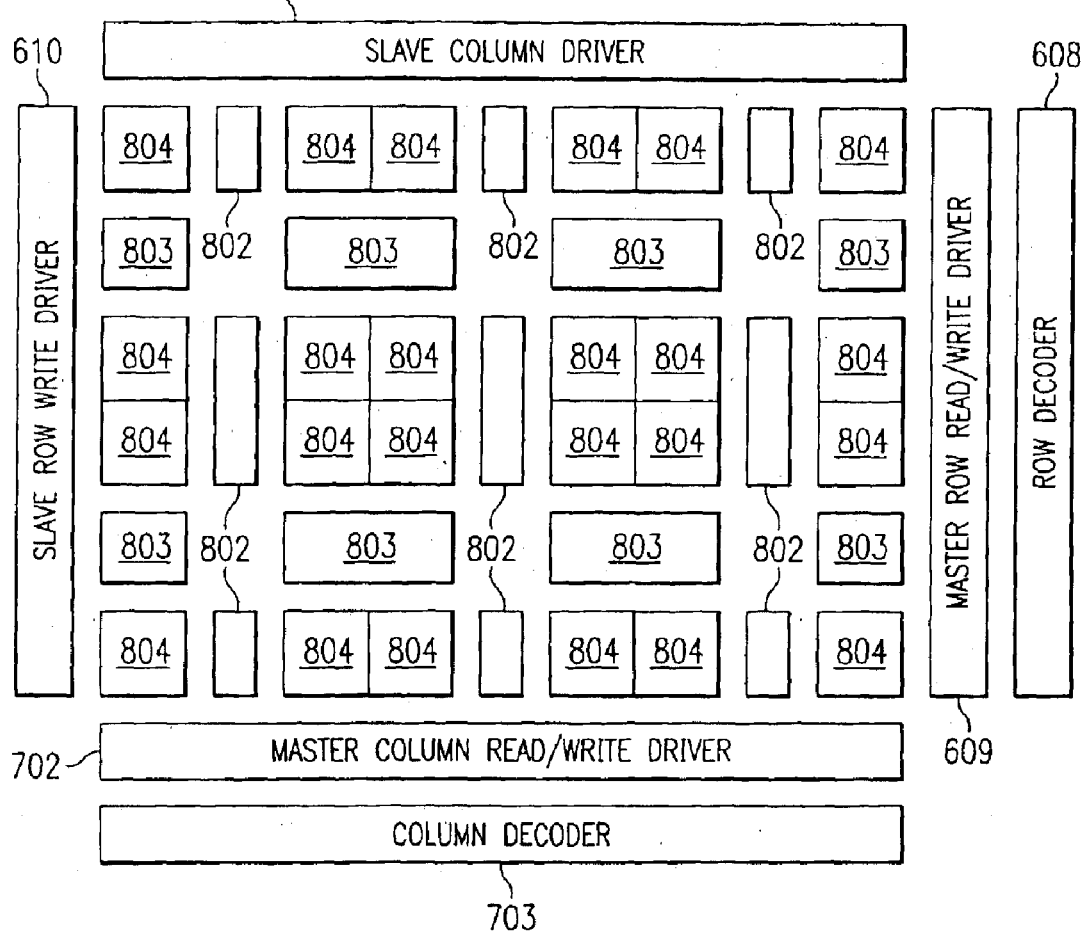
FIG. 8 is a block diagram of an MRAM chip showing the row and the column taps and their relationship to arrays and decoders.

FIG. 8 is a block diagram of the general arrangement of an MRAM chip showing the row and the column taps and their relationship to arrays and decoders. While an array of a specific size is presented in FIG. 8 for purposes of illustration, the array may be larger including larger and/or more sub-arrays and support electronics or, conversely, smaller. The MRAM chip includes column decoder 703, master column read/write driver 702, slave column read/write driver 801, row decoder 608, master row read/write driver 609, slave row write driver 610, local row taps 802, local column taps 803 and memory sub-arrays (cell subarray or array blocks) 804. Column decoder 703 and row decoder 608 receive respective portions of an address signal and, in response, select a column or group of columns (column decoder 703) and a row (row decoder 608) designating the cells to be read. Typically, individual rows are selected as opposed to groups of rows. Columns also may be selected individually or in groups. Master read/write drivers 609 and 702 are respectively associated with slave write driver for rows 610 and columns 801. In this embodiment, located between the drivers are MRAM cell subarray 804, associated local column taps 803 and associated row taps 802. As discussed, column taps or column select circuits, include column select transistors and are positioned between two cell subarray blocks 804. The array will be built up as cell subarray 804, column tap 803, cell subarray 804, cell subarray 804, column tap 803, cell subarray 804. Similarly row select circuit or local row taps 802 are also positioned between cell subarray blocks 804. The arrangement of local row taps 802 to memory array blocks may be array block 804, row tap 802, array block 804, array block 804, row tap 802, array block 804. In actual implementation, taps 802 require relatively little chip real estate resulting in very efficient packing of an array of subarrays surrounded by support circuitry for driving the write currents.

This embodiment of the invention includes a support circuit for writing to and reading from four-conductor MRAMs including row decoder 608, first read/write row driver 609 connected to the row decoder 608, plurality of global row write conductors (601, 604 and 605 in FIG. 6) connected to first read/write row driver 609; plurality of row taps 802 connected to each of the global row write conductors; second read/write row driver 610 connected to the global row write conductors; column decoder 703; first read/write column driver 702 connected to column decoder 703; plurality of global column conductors (706 and 707 in FIG. 7) connected to first read/write column driver 702; plurality of column taps 803 connected to each of the global column write conductors; and second read/write column driver 801 connected to the global column write conductors.

The global row write conductor may be connected to a control gate in the row tap support circuit and the control gate connects a selected local row sense line to a read first potential. The control gate further connects all of the unselected local row sense lines to a nonselect second potential. The global column write conductor is connected to a control gate of a transistor of the column tap support circuit, the control gate connecting a selected local column sense line to a second read potential generated via a sense amplifier. A second global column write conductor line of the plurality of global column write conductors lines is connected to a second control gate of a transistor of the column tap support circuit and the control gate may connect a second selected local column sense line to a second read potential generated by a second sense amplifier. The global row write conductor constitutes a first conductor of the four-conductor memory cell that make up the MRAM cells. The global column row write conductor is a second conductor of the four-conductor memory cell that make up the MRAM cells.

FIG. 9 is a flow chart for applying read potentials in an array comprised of four-conductor MRAM. The method starts at step 900 and, at step 901, a first logic potential supplied to selected global rows while a second logic potential is applied to unselected global rows. At step 902 a first logic potential is applied to selected global columns and a second logic potential is applied to unselected global columns. A first read potential is applied at step 903 to selected row and sense lines together with the first global row logic potential. A second read potential is applied to unselected row and sense lines at step 904 together with the second global row of logic potential. The input of a sense amplifier is connected to the selected columns sense conductor at step 905 together with the first global column logic potential. At step 906 the input of the sense amplifier is disconnected from the unselected column sense conductors with the second global column logic potential. The sense amplifier is activated at step 907 with a row block sense control signal. Step 908 selects a memory cell with appropriate connections and read potentials to start the sense operation, the method terminating at step 909.

FIG. 10 is a flow chart of a method for applying write current in an array comprising a four-conductor MRAM. Starting at step 1000, at step 1001 all sense amplifiers are deactivated with the row block control signal. Write operations are being done at step 1002 and, at step 1003, one row is selected to which to apply a write current. One column is selected per column slice at step 1004, that column being the one to which a write current is to be applied. A write data signal is supplied to the column master and slave write drives at step 1005. At step 1006, a row write current is applied to the selected global row write conductor with the row master/slave write drivers. Column write currents are applied at step 1007 to select a global column write conductor with the column master/slave write drivers in directions determined by data supplied in step 1005. The write operation is ended at step 1008 by turning off the write currents in the proper sequence to end the write operation, the method terminating at step 1009.

While the circuitry of the current invention has been described to interface to a four-conductor MRAM cell, the invention further includes modifications of this circuitry to support or control other MRAM configurations.

What is claimed is:

1. A control circuit for writing to and reading from Magnetic Random Access Memory (MRAM) cells comprising:

a row decoder;

a first read/write row driver connected to said row decoder;

a plurality of global row write conductors connected to said first read/write row driver;

a plurality of row taps connected to each of said global row write conductors, each row tap comprising a select transistor for controlling voltage potentials of local row sense lines; and a second read/write row driver connected to said global row write conductors.

2. The control circuit of claim 1 wherein each of said global row write conductors is connected to respective control gates in a row tap support circuit, the control gates connect a selected local row sense line to a read potential and said control gate further connects all unselected local row sense lines to a second potential.

3. The control circuit of claim 2 wherein said global row write conductor is a first conductor of a four-conductor memory cell in the MRAM cells.

4. A circuit for writing to and reading from four-conductor Magnetic Random Access Memory (MRAM) comprising:

a row decoder;

a first read/write row driver connected to said row decoder;

a plurality of global row write conductors connected to said first read/write row driver;

a plurality of row taps connected to respective global row write conductor signal lines;

a second read/write row driver connected to said global row write conductors;

a column decoder;

a first read/write column driver connected to said column decoder;

a plurality of global column write conductors connected to said first read/write column driver;

a plurality of column taps connected to each of said global column write conductors, each row tap comprising a select transistor for controlling voltage potentials of local row sense lines; and a second read/write column driver connected to said global column write conductors.

5. The circuit of claim 4 wherein one of said global row write conductors is connected to a control gate in a row tap support circuit, wherein the control gate connects a selected local row sense line to a read potential, and said control gate further connects nonselected local row sense lines to a second potential.

6. The circuit of claim 4 wherein one of said global column write conductors is selectively connected to a control gate in a column tap support circuit and the control gate connects a selected local column sense line to an input terminal of a sense amplifier.

7. The circuit of claim 6 wherein a second global column write conductor of the plurality of global column write conductors is connected to a second control gate in the column tap support circuit and the control gate connects a second selected local column sense line to a second read potential generated by a second sense amplifier.

8. The circuit of claim 4 wherein said global row write conductor is a first conductor of a four-conductor MRAM.

9. The support circuit of claim 4 wherein said global column write conductor is a second conductor of a four-conductor MRAM.

10. A circuit for writing to and reading from four-conductor Magnetic Random Access Memories (MRAMs) comprising:

a column decoder;

a first read/write column driver connected to said column decoder;

a plurality of global column write conductors connected to said first read/write column driver;

a plurality a column taps connected to each of said global column write conductors, each row tap comprising a select transistor for controlling voltage potentials of local row sense lines; and a second read/write column driver connected to said global column write conductor.

11. The circuit of claim 10 wherein each of said global column write conductors is connected to a control gate in a column tap support circuit and the control gate connects a selected local column sense line to an input terminal of a sense amplifier.

12. The circuit of claim 11 wherein said global column write conductor is a second conductor of a four-conductor MRAM.

13. The circuit of claim 10 further including:

a row decoder; and a first read/write row driver connected to said row decoder; and a plurality of global row write conductors connected to a first read/write row driver.

* * * * *